United States Patent
Yu

(10) Patent No.: US 6,524,920 B1
(45) Date of Patent: *Feb. 25, 2003

(54) LOW TEMPERATURE PROCESS FOR A TRANSISTOR WITH ELEVATED SOURCE AND DRAIN

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/779,988

(22) Filed: Feb. 9, 2001

(51) Int. Cl.[7] .......................................... H01L 21/336
(52) U.S. Cl. ........................................ 438/303; 438/305
(58) Field of Search ............................... 438/303, 305

(56) References Cited

U.S. PATENT DOCUMENTS

| | | | | |
|---|---|---|---|---|
| 4,998,150 A | * | 3/1991 | Rodder et al. .............. 357/23.1 |
| 5,102,816 A | * | 4/1992 | Manukonda et al. ......... 437/44 |
| 5,168,072 A | * | 12/1992 | Moslehi ....................... 437/41 |
| 5,200,352 A | | 4/1993 | Pfiester ........................ 437/44 |
| 5,320,974 A | | 6/1994 | Hori et al. .................... 437/44 |
| 5,733,792 A | | 3/1998 | Matsuoka .................... 437/35 |
| 5,753,542 A | * | 5/1998 | Yamazaki et al. .......... 438/162 |
| 5,789,792 A | | 8/1998 | Tsutsumi .................... 257/506 |
| 5,960,270 A | | 9/1999 | Misra et al. ................. 438/197 |
| 6,025,254 A | | 2/2000 | Doyle et al. ................ 438/592 |
| 6,033,958 A | | 3/2000 | Chou et al. ................. 438/275 |
| 6,051,473 A | * | 4/2000 | Ischida et al. .............. 438/300 |
| 6,057,200 A | * | 5/2000 | Prall et al. .................. 438/300 |
| 6,083,798 A | | 7/2000 | Lin .............................. 438/297 |
| 6,090,691 A | | 7/2000 | Ang et al. ................... 438/564 |
| 6,110,787 A | | 8/2000 | Chan et al. ................. 438/300 |
| 6,124,176 A | | 9/2000 | Togo ........................... 438/305 |
| 6,171,910 B1 | | 1/2001 | Hobbs et al. ............... 438/275 |
| 6,194,748 B1 | | 2/2001 | Yu ............................... 257/216 |
| 6,211,026 B1 | | 4/2001 | Ahmad et al. .............. 438/300 |
| 6,216,357 B1 | | 4/2001 | Victor et al. ................. 33/810 |
| 6,228,722 B1 | | 5/2001 | Lu .............................. 438/279 |
| 6,248,637 B1 | | 6/2001 | Yu ............................... 438/300 |
| 6,300,201 B1 | | 10/2001 | Shao et al. .................. 438/281 |
| 6,300,203 B1 | | 10/2001 | Buynoski et al. ........... 438/287 |
| 6,316,357 B1 | * | 11/2001 | Lin et al. ..................... 438/662 |
| 6,380,043 B1 | * | 4/2002 | Yu ............................... 438/305 |

OTHER PUBLICATIONS

"Silicon Processing for the VLSI Era, vol. 1: Process Technology", Wolf, et al. Lattice Press, Sunset Beach, California, 1986, pp. 296–308.

"Sub 50–nm Fin FET: PMOS" Huang, et al., Department of Electrical Engineering & Computer Sciences University of California at Berkeley, 1999, IEEE.

"Ultra–Thin–Body Silicon–On–Insulator MOSFET's for Terabit–Scale Integration", Yu, et al., Department of Electrical Engineering & Computer Sciences, University of California, Berkeley, pp. 623–626.

* cited by examiner

Primary Examiner—Richard Elms
Assistant Examiner—Michael K. Luhrs
(74) Attorney, Agent, or Firm—Foley & Lardner

(57) ABSTRACT

A method of manufacturing an integrated circuit utilizes solid phase epitaxy to form an elevated source region and an elevated drain region. The method includes providing an amorphous semiconductor material and crystallizing the amorphous semiconductor material without damaging a high-k gate dielectric layer. The gate structure includes L-shaped liners. The semiconductor material can be silicided. A shallow source drain implant can also be provided.

20 Claims, 2 Drawing Sheets

LOW TEMPERATURE PROCESS FOR A TRANSISTOR WITH ELEVATED SOURCE AND DRAIN

CROSS-REFERENCE TO RELATED APPLICATIONS

This patent application is related to U.S. application Ser. No. 09/405,831, filed on Sep. 24, 1999, by Yu, entitled "A Process for Manufacturing MOS Transistors Having Elevated Source and Drain Regions," now issued U.S. Pat. No. 6,248,637, U.S. application Ser. No. 09/255,546, filed on Feb. 22, 1999, by Yu entitled "Locally Confined Deep Pocket Process for ULSI MOSFETS," now issued U.S, Pat. No. 6,271,095, U.S. application Ser. No. 09/397,217 filed on Sep. 16, 1999 by Yu et al. entitled "Source/Drain Doping Technique for Ultra-Thin-Body SOI MOS Transistors," now issued U.S. Pat. No. 6,403,433, and U.S. application Ser. No. 09/384,121 filed on Aug. 27, 1999, by Yu entitled "CMOS Transistors Fabricated in Optimized RTA Scheme." Now issued U.S. Pat. No. 6,265,293. This patent application is also related to U.S. application Ser. No. 09/609,613 filed on Jul. 5, 2000 herewith by Yu entitled "A Process for Manufacturing MOS Transistors having Elevated Source and Drain Regions",now issued U.S. Pat. No. 6,399,450. This patent application is also related to U.S. patent application Ser. No. 09/781,039, filed on an even date herewith by Yu, entitled "Low Temperature Process to Locally Form High-K Gate Dielectrics," U.S. patent application Ser. No. 09/779, 985, filed on an even date herewith Yu, entitled "Replacement Gate Process for Transistors Having Elevated Source and Drain Regions," U.S. patent application Ser. No. 09/779, 987, filed on an even date herewith by Yu, entitled "Process For Manufacturing MOS Transistors Having Elevated Source and Drain Regions and a High-k Gate Dielectric," now issued U.S. Pat. No. 6,403,434, U.S. patent application Ser. No. 09/780,043, filed on an even date herewith by Yu, entitled "Low Temperature Process for MOSFET with Elevated Source and Drain," and U.S. patent application Ser. No. 09/779,986, filed on an even date herewith by Yu, entitled "A Low Temperature Process For A Thin Film Transistor." All of the above patent applications are assigned to the assignee of the present application.

BACKGROUND OF THE INVENTION

The present application relates to integrated circuits (ICs) and methods of manufacturing integrated circuits. More particularly, the present application relates to a method of manufacturing integrated circuits having transistors with elevated source and drain regions and high-k gate dielectrics.

Currently, deep-submicron complementary metal oxide semiconductor (CMOS) is the primary technology for ultra-large scale integrated (ULSI) devices. Over the last two decades, reducing the size of CMOS transistors and increasing transistor density on ICs has been a principal focus of the microelectronics industry. An ultra-large scale integrated circuit can include over 1 million transistors.

The ULSI circuit can include CMOS field effect transistors (FETS) which have semiconductor gates disposed between drain and source regions. The drain and source regions are typically heavily doped with a P-type dopant (boron) or an N-type dopant (phosphorous).

The drain and source regions generally include thin extensions (shallow source and drain extensions) that are disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-induced barrier-lowering. Shallow source and drain extensions and, hence, controlling short-channel effects, are particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or an ion implantation process. Without the sidewall spacers, the doping process introduces dopants into a thin region just below the top surface of the substrate to form the drain and source extensions as well as to partially form the drain and source regions.

After the drain and source extensions are formed, silicon dioxide spacers, which abut lateral sides of the gate structure, are provided over the source and drain extensions. With the silicon dioxide spacers in place, the substrate is doped a second time to form deep source and drain regions. During formation of the deep source and drain regions, further doping of the source and drain extensions is inhibited due to the blocking capability of the silicon dioxide spacers.

As the size of transistors disposed on ICs decreases, transistors with shallow and ultra-shallow source/drain extensions become more difficult to manufacture. For example, a small transistor may require ultra-shallow source and drain extensions with a junction depth of less than 30 nanometers (nm). Forming source and drain extensions with junction depths of less than 30 nm is very difficult using conventional fabrication techniques. Conventional ion implantation techniques have difficulty maintaining shallow source and drain extensions because point defects generated in the bulk semiconductor substrate during ion implantation can cause the dopant to more easily diffuse (transient enhanced diffusion, TED). The diffusion often extends the source and drain extension vertically downward into the bulk semiconductor substrate. Also, conventional ion implantation and diffusion-doping techniques make transistors on the IC susceptible to short-channel effects, which result in a dopant profile tail distribution that extends deep into the substrate.

The source region and drain regions can be raised by selective silicon (Si) epitaxy to make connections to source and drain contacts less difficult. The raised source and drain regions provide additional material for contact silicidation processes and reduce deep source/drain junction resistance and source/drain series resistance. However, the epitaxy process that forms the raised source and drain regions generally requires high temperatures exceeding 1000° C. (e.g., 1100–1200° C.). Further, silicidation processes can also require high temperatures. These high temperatures increase the thermal budget of the process and can adversely affect the formation of steep retrograde well regions and ultra shallow source/drain extensions.

The high temperatures, often referred to as a high thermal budget, can produce significant thermal diffusion which can cause shorts between the source and drain region (between the source/drain extensions). The potential for shorting between the source and drain region increases as gate lengths decrease.

In addition, high temperature processes over 750 to 800° C. can cause dielectric materials with a high dielectric constant (k) to react with the substrate (e.g., silicon). High-k (k>8) gate dielectrics are desirable as critical transistor dimensions continue to decrease. The reduction of critical dimensions requires that the thickness of the gate oxide also be reduced. A major drawback of the decreased gate oxide thickness (e.g., <30 Å) is that direct tunneling gate leakage current increases as gate oxide thickness decreases. To suppress gate leakage current, material with a high dielectric constant (k) can be used as a gate dielectric instead of the conventional gate oxides, such as thermally grown silicon dioxide.

High-k gate dielectric materials have advantages over conventional gate oxides. A high-k gate dielectric material with the same effective electrical thickness (same capacitive effect) as a thermal oxide is much thicker physically than the conventional oxide. Being thicker physically, the high-k dielectric gate insulator is less susceptible to direct tunnel leakage current. Tunnel leakage current is exponentially proportional to the gate dielectric thickness. Thus, using a high-k dielectric gate insulator significantly reduces the direct tunneling current flow through the gate insulator.

High-k materials include, for example, aluminum oxide ($Al_2O_3$), titanium dioxide ($TiO_2$), and tantalum pentaoxide ($TaO_5$). Aluminum oxide has a dielectric constant (k) equal to eight (8) and is relatively easy to make as a gate insulator for a very small transistor. Small transistors often have a physical gate length of less than 80 nm.

Thus, there is a need for an integrated circuit or electronic device that includes transistors not susceptible to shorts caused by dopant thermal diffusion. Further still, there is a need for transistors with elevated source and drain regions manufactured in an optimized annealing process. Even further still, there is a need for elevated source and drain regions which are formed in a low thermal budget (low temperature) process. Yet further, there is a need for a transistor with elevated source and drain regions and a high-k gate dielectric. Yet even further, there is a need for a process of forming a transistor with elevated source and drain regions and a high-k gate dielectric in a low thermal budget process.

SUMMARY OF THE INVENTION

An exemplary embodiment relates to a method of manufacturing an integrated circuit. The integrated circuit includes a gate structure on a substrate. The substrate includes a shallow source extension and a shallow drain extension. The gate structure includes a gate conductor above a high-k gate dielectric. The method includes steps of: providing the gate structure on the substrate, forming a shallow amorphous region in the substrate, and providing L-shaped liners on sidewalls of the gate structure. The method also includes steps of: providing an amorphous semiconductor layer above the substrate and over the gate structure, removing a portion of the amorphous semiconductor material to expose the gate structure, and forming a single crystalline semiconductor material from the amorphous semiconductor material and the shallow amorphous region.

Another exemplary embodiment relates to a method of manufacturing an ultra-large scale integrated circuit including a transistor. The method includes providing a gate structure on a top surface of a substrate, depositing an amorphous semiconductor material above the top surface of the substrate, and crystallizing the amorphous semiconductor material. The gate structure includes a gate conductor, a high-k gate dielectric and L-shaped liners. The amorphous semiconductor material is crystallized in an annealing process.

Yet another exemplary embodiment relates to a process of forming a transistor with elevated source and drain regions. The process includes providing a gate structure, providing an amorphization implant to a substrate, providing a spacer structure to the gate structure, depositing an amorphous semiconductor material above the substrate and the gate structure, and crystallizing the amorphous semiconductor material to form single crystalline material. The gate structure includes a high-k gate dielectric above the substrate. The spacer structure includes L-shaped liners.

BRIEF DESCRIPTION OF THE DRAWINGS

Exemplary embodiments will hereafter be described with reference to the accompanying drawings, wherein like numerals denote like elements, and.

DETAILED DESCRIPTION OF THE PREFERRED EMBODIMENTS

Figure 1:
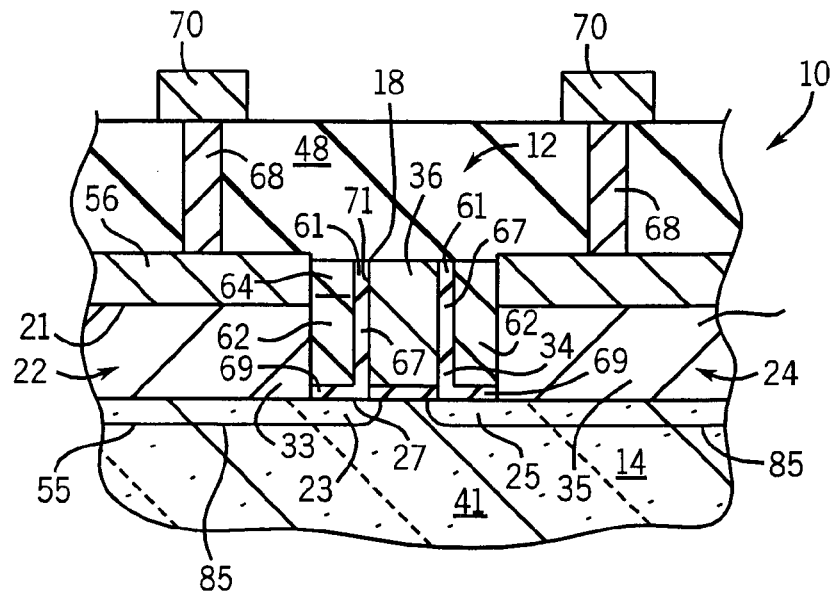
FIG. 1 is a cross-sectional view of a portion of an integrated circuit in accordance with an exemplary embodiment of the present invention, the integrated circuit including a transistor with elevated source and drain regions and a high-k gate dielectric.

With reference to FIG. 1, a portion 10 of an integrated circuit (IC) includes a transistor 12 which is disposed on a semiconductor substrate 14, such as, a wafer. Semiconductor substrate 14 is preferably a bulk P-type silicon substrate. Alternatively, substrate 14 can be any type of IC substrate including a gallium arsenide (GaAs), germanium, or semiconductor-on-insulator (SOI) substrate (e.g., a silicon-on-glass substrate).

Transistor 12 can be a P-channel or N-channel metal oxide semiconductor field effect transistor (MOSFET) and is described below as an N-channel transistor. Transistor 12 includes a gate structure 18, an elevated source region 22, and an elevated drain region 24.

Regions 22 and 24 extend from a top surface 21 (above a top surface 27 of substrate 14) to a bottom 55 in substrate 14. Regions 22 and 24 are 200–1000 Å deep (from surface 21 to bottom 55) and include a source extension 23, a drain extension 25, a deep source region 33, and a deep drain region 35. For an N-channel transistor, regions 22 and 24 are heavily doped with N-type dopants (e.g., $5 \times 10^{19} - 1 \times 10^{20}$ dopants per cubic centimeter). For a P-channel transistor, regions 22 and 24 are heavily doped with P-type dopants (e.g., $5 \times 10^{19} - 1 \times 10^{20}$ dopants per cubic centimeter).

Extensions 23 and 25 are preferably ultra-shallow extensions (e.g., junction depth is less than 20 nanometers (nm), 100–250 Å), which are thinner than regions 33 and 35. Extensions 23 and 25 are connected to regions 33 and 35, respectively, and are disposed partially underneath gate structure 18. Regions 33 and 35 are preferably more than 100 Å thick (e.g. 150 to 300 Å) from surface 21 to surface 27.

A channel region 41 underneath gate structure 18 separates extensions 23 and 25. Region 41 can be doped according to various device parameters. For example, channel region 41 can be doped according to a super-steep retrograded well region.

Ultra-shallow extensions 23 and 25 help transistor 12 achieve substantial immunity to short-channel effects. Short-channel effects can degrade the performance of transistor 12 as well as the manufacturability of the IC associated with transistor 12. Regions 22 and 24 and extensions 23 and 25 have a concentration of $10^{19}$ to $10^{20}$ dopants per cubic centimeter. Appropriate dopants for a P-channel transistor include boron, boron diflouride, or iridium, and appropriate dopants for N-type transistors include arsenic, phosphorous, or antimony.

Gate stack or structure 18 includes a gate dielectric layer 34 and a gate conductor 36. Dielectric layer 34 is preferably comprised of a high-k dielectric material. Layer 34 is preferably a 2–10 nm thick conformal layer of tantalum pentaoxide ($Ta_2O_5$), aluminum oxide ($Al_2O_3$), titanium dioxide ($TiO_2$) or other material having a dielectric constant (k) over or at least 8. Dielectric layer 34 can be disposed directly above substrate 14. Layer 34 can be a 5–20 nm thick layer of amorphous $Ta_2O_5$ material. Preferably, layer 34 is 5–10 nm.

A 30–40 nm thick layer of gate conductor 36 is disposed above dielectric layer 34. Gate conductor 36 is preferably a metal, such as W or TiN. Alternatively, conductor 36 can be polysilicon or polysilicon/germanium. Gate structure 18 has a height or thickness of 500–2000 Å. Alternatively, other materials and dimensions can be used for conductor 36.

Gate structure 18 is disposed over channel region 41. Gate structure 18 can also include liners 61 and spacers 62. Liners 61 are preferably L-shaped and include a segment 67 and a segment 69. Segment 67 includes a sidewall 64. Segment 67 is disposed against sidewall 71 of gate conductor 36.

Segment 69 is preferably 100–500 Å wide (from left to right) and 100–300 Å thick (from top to bottom). Segment 67 is preferably 100–300 Å wide (from left to right) and 500–2000 Å thick (from top to bottom). Segments 67 and 69 preferably each have a relatively rectangular shape. Liner 61 can be comprised of an insulative material such as silicon dioxide, or other oxide material. Preferably, liners 61 are a different material than spacers 62. Liners 61 perform the function of buffer layer between nitride spacer and silicon substrate.

Spacers 62 abut sidewalls 64 of segments 67 of liners 61. Spacers 62 are preferably silicon nitride ($Si_3N_4$) having a width of 50–100 Å and a thickness (height) of 500–2000 Å. Spacers 62 provide an insulative buffer between conductor 36 and regions 22 and 24. Spacers 62 have a relatively rectangular shape.

A silicide layer 56 is disposed on top of source region 22 and drain region 24. Preferably, layer 56 is a nickel silicide ($NiSi_x$). Alternatively, layer 56 can be any type of refractory metal and silicon combination, such as, cobalt silicide, tungsten silicide, or other silicide material. Preferably, layer 56 is 150–300 Å thick. Metal contacts 68 can be coupled to layer 56 through insulating layer 48 to connect regions 22 and 24 to conductive lines 70.

With reference to FIGS. 1–5, the fabrication of transistor 12, including high-k gate dielectric layer 34, elevated source region 22 and elevated drain region 24, is described as follows. The advantageous process allows deep source and drain regions 33 and 35 to be formed with appropriate dopant activation without adversely affecting layer 34. The process also reduces the lateral spread of dopants into channel 41 by maintaining temperatures below 600° C. and thereby reduces susceptibility to short circuits between extensions 23 and 25.

Figure 2:
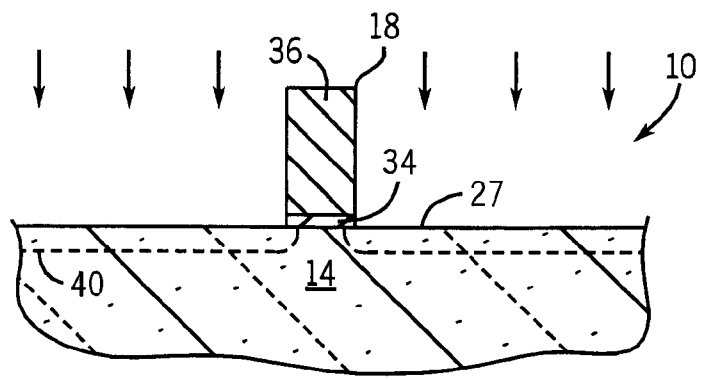
FIG. 2 is a cross-sectional view of the portion of the integrated circuit illustrated in FIG. 1, showing a gate stack formation step, a shallow amorphization implant step, and a shallow source and drain extension dopant implant step.

With reference to FIG. 2, a gate stack or gate structure 18 including a gate conductor 36 and a gate dielectric layer 34 is fabricated using conventional lithographic processes. Preferably, gate dielectric layer 34 is deposited or formed on top of surface 27 and conductor 36 is deposited or formed over layer 34. Conductor 36 and layer 34 can be deposited by CVD. Conductor 36 and layer 34 are selectively etched to leave gate structure 18 on a top surface 27 of substrate 14. Preferably, conductor 36 is 500 to 2000 Å thick above a 10 to 60 Å thick layer 34.

Layer 34 is preferably deposited in a metal organic CVD process. Alternatively, layer 34 can be provided by sputter deposition or a CVD process. According to another alternative, layer 34 can be formed according to the process of U.S. Pat. No. 6,100,120.

After gate structure 18 is formed, substrate 14 is subject to a shallow amorphization implant to form an amorphization or amorphous region 40. Amorphous region 40 can be created by subjecting substrate 14 to an ion implantation technique. Ion implantation can be performed by implantation devices manufactured by companies, such as, Varian Company of Palo Alto, Calif., Genius Company, and Applied Materials, Inc. Region 40 is preferably a shallow or thin amorphous region or layer of substrate 14 (e.g., a depth between 100 and 500 Å). The implantation technique can charge semiconductor ions, preferably, electrically neutral species (such as,silicon, germanium, or xenon ions) to approximately 10–100 kilo-electron volts (keVs) and implant them into substrate 14. The silicon, germanium or xenon ions change the single crystal silicon associated with substrate 14 into amorphous silicon at region 40. Region 40 corresponds to source and drain regions 22 and 24. Channel region 41 is protected during the implant by gate structure 18.

After region 40 is formed, substrate 14 is subjected to a follow-up dopant implant (a shallow source/drain extension dopant implant). Preferably, N-type or P-type dopants are provided by ion implantation to a depth of 100–250 Å below surface 27. The dopants can be implanted in a conventional ion implantation technique (e.g., as ions at 500–1000 keV at a dose of $2 \times 10^{14}$–$1 \times 10^{15}$ dopants per square centimeter). The source drain extension dopant implant is for the formation of extensions 23 and 25 (FIG. 1) in substrate 14. Channel region 41 is protected during the implant by gate structure 18.

Figure 3:
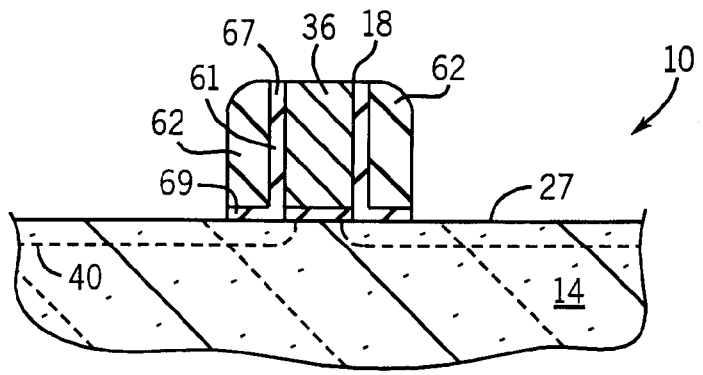
FIG. 3 is a cross-sectional view of the portion of the integrated circuit illustrated in FIG. 1, showing an L-shaped liner formation step and a spacer formation step.

In FIG. 3, portion 10 is subject to a liner formation process. Preferably, a liner 61 is formed by conformally depositing a thin layer of insulative material. Preferably, the insulative material is an oxide, such as, silicon dioxide. The conformal deposition is preferably performed at low temperature (LTCVD (less than 400° C.)). The low temperature process prevents recrystallization of amorphous region 40.

In FIG. 3, after the conformal layer for liners 61 is deposited, portion 10 is subjected to a spacer formation process which creates spacers 62 on sidewalls 64 of liners 61. Preferably, spacers 62 are narrow and are formed in a low temperature process (less than 400° C.) to avoid recrystallization of region 40. Spacers 62 are preferably 50–200 Å wide (e.g., left to right) and 500–2000 Å thick (e.g., top (from a top surface of layer 80) to bottom (to top surface 37)). Spacers 62 are formed in a conventional LTCVD and etch-back process. After the etchback step, the conformal layer for liners 61 is etched using spacers 62 as a self-aligned mask. The conformal layer can be etched in a dry etching process selective to liners 61 with respect to spacers 62, thereby leaving segments 67 and 69.

Figure 4:
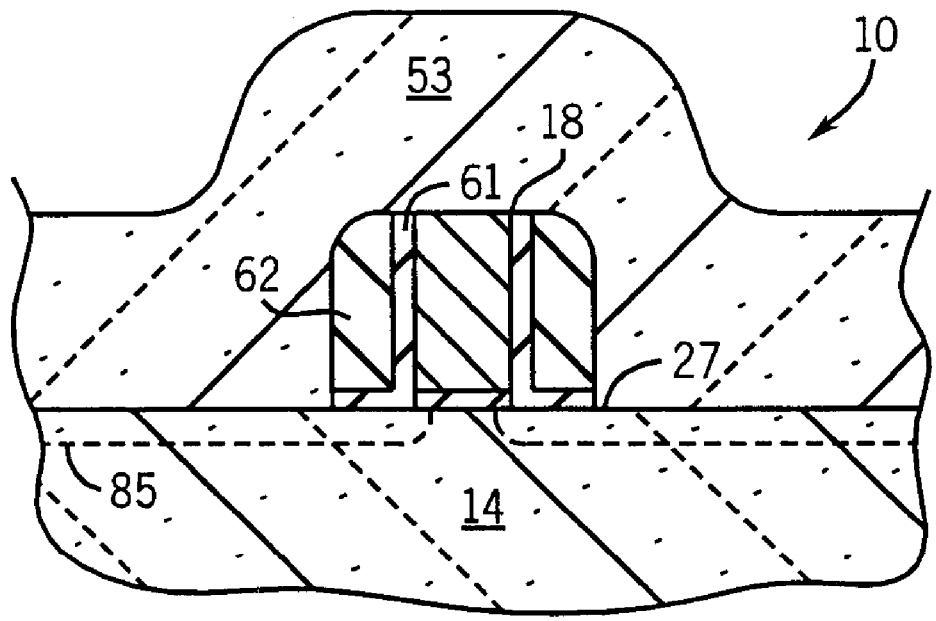
FIG. 4 is a cross-sectional view of the portion of the integrated circuit illustrated in FIG. 1, showing an amorphous semiconductor layer deposition step.

In FIG. 4, after gate structure 18 is formed including liners 61 and spacers 62, portion 10 is subjected to a deposition process which provides an amorphous semiconductor layer 53 above substrate 14. Layer 53 is preferably a 2000–5000 Å thick film of the same material as substrate 14 (e.g., silicon). Alternatively, layer 53 can be or include other semiconductor materials such as germanium. Layer 53 can be deposited by low pressure, chemical vapor deposition (LPCVD) at temperatures of less than 450° C. (400–450° C.). Layer 53 corresponds to portions of regions 33 and 35 above top surface 27 of substrate 14 (See FIG. 1).

Layer 53 is preferably an in-situ doped amorphous silicon material. Layer 53 is in-situ doped utilizing non-neutral dopants, such as, phosphorous (P), boron (B), arsenic (As), antimony (Sb), indium (In), and gallium (Ga). The dopants correspond to source region 22 and drain region 24 (FIG. 1).

After layer 53 is deposited, an amorphous material border 85 is located below surface 27 of substrate 14. Border 85 includes a bottom of region 40. Region 40 underneath spacers 62 and liners 61 corresponds to shallow source and drain extensions 23 and 25 discussed below with reference to FIG. 1.

Figure 5:
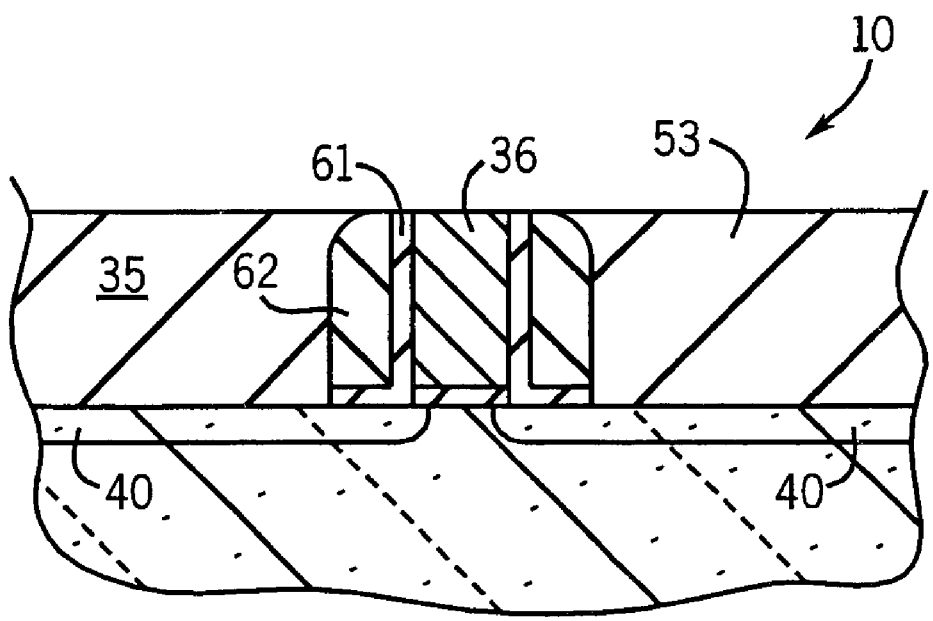
FIG. 5 is a cross-sectional view of the portion of the integrated circuit illustrated in FIG. 1, showing a chemical mechanical polish (CMP) step and an annealing step.

In FIG. 5, after layer 53 is provided over substrate 14, layer 53 is subject to a planarization process, such as, a chemical mechanical polish (CMP). The CMP step removes layer 53 to expose gate conductor 36 in structure 18.

After the CMP step to expose conductor 36, an overetch technique can further lower layer 53, spacer 62, liner 61 and conductor 36. Preferably, the overetch forms a rectangular-shaped spacer 62 (FIG. 1). The overetch process used to lower layer 53 can be a dry or wet etch process. The overetch step prevents bridging during subsequent silicidation steps described below with reference to FIG. 1. Alternatively, the overetch step can be a continuation of the CMP step used to expose conductor 36.

In FIG. 1, after overetching, layer 53 is subjected to an annealing process. The annealing process changes the structure of layer 53 from an amorphous state to a single crystalline state (e.g., melts layer 53 which subsequently recrystallizes). Substrate 14 below border 85 acts as a seed layer for layer 53.

In one embodiment, the annealing process is a low temperature annealing at less than 600° C. (550–600° C.). The annealing technique utilizes principles of solid phase epitaxy to crystallize layer 53 and shallow amorphous region 40.

Solid phase epitaxy refers to a crystallization process by which an amorphous semiconductor film (silicon, silicon/germanium, or germanium) is converted into crystalline semiconductor (silicon, silicon/germanium, or germanium) of a single orientation matching the orientation of an existing crystalline semiconductor (silicon, silicon/germanium, or germanium) start layer (e.g., substrate 14). Solid phase epitaxy is usually achieved by heating the amorphous material.

The solid phase epitaxy is performed at a low temperature so that the thermal budget in the process is not adversely affected. In this way, dielectric layer 34 is not affected by the transformation of the layer 53 from an amorphous state to a single crystalline state.

In one alternative embodiment, the annealing process can be an excimer laser annealing process (e.g., 308 nanometer wavelength for a pulse duration of several nanoseconds). The annealing technique using the excimer laser can raise layer 53 to the melting temperature of layer 53 (1100° C.). The melting temperature of layer 53 in the amorphous state is significantly lower then that of substrate 14 in the single crystalline state. The melting temperature of amorphous silicon is 1100° C. and the melting temperature of single crystalline silicon is 1400° C. Preferably, the annealing process is controlled so that layer 53 is fully melted and substrate 14 is not melted. After the energy associated with the annealing process is removed, layer 53 is recrystallized as single crystalline material.

Liners 61 and spacers 62 as well as conductor 36 advantageously protect layer 34 during the annealing process.

In FIG. 1, layer 56 is formed above regions 22 and 24 and conductor 36. Layer 56 is preferably formed in a self-aligned silicide process. The process is preferably a low temperature 400–500° C. nickel silicide process. Layer 56 can be $CoSi_2$, $TiSi$, $NiSi_2$, etc. Elevated source and drain regions, regions 22 and 24, allow space for layer 56 to form, thereby decreasing source/drain contact resistance.

Layer 56 is preferably 150–300 Å thick and approximately 30–50 percent of its thickness consumes layer 53. With reference to FIG. 1, after layer 56 is formed, layer 48 is deposited in accordance with a tetraethylorthosilicate (TEOS) process. Preferably, layer 48 is 5000–15000 Å thick. After layer 48 is deposited, conventional MOSFET fabrication processes can be utilized to form contacts 68, lines 70, vias, interconnects, and other devices necessary for portion 10 of the integrated circuit.

According to one embodiment, after deposition of layer 48, layer 48 is planarized and etched to form vias for contacts 68. Contact 68 can be provided to connect layers 56 to conductive line 70. Conductive line 70 can be formed above layer 48 by conventional interconnect layer fabrication processes.

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. For example, although specific types of structures are shown, other structures can be utilized. Various changes may be made to the details disclosed without departing from the scope of the invention which is defined by the following claims.

What is claimed is:

1. A method of manufacturing an integrated circuit, the integrated circuit including a gate structure on a substrate, the substrate including a shallow source extension and a shallow drain extension, the gate structure including a gate conductor above a high-k gate dielectric, the method comprising steps of:

providing the gate structure on the substrate;

forming a shallow amorphous region in the substrate;

providing L-shaped liners on sidewalls of the gate structure;

providing an amorphous semiconductor material above the substrate and over the gate structure;

removing a portion of the amorphous semiconductor material to expose the gate structure; and forming a single crystalline semiconductor material from the amorphous semiconductor material and the shallow amorphous region.

2. The method of claim 1, further comprising:
providing a spacer after providing the L-shaped liner.

3. The method of claim 1, further comprising:
after the step of forming a single crystalline semiconductor material, siliciding the single crystalline material at a source location and at a drain location, the single crystalline material being silicided at a location above an original top surface of the substrate.

4. The method of claim 3, wherein the siliciding step is a nickel silicide process performed at a temperature of less than 500° C.

5. The method of claim 1, further comprising doping the shallow amorphous region before providing the L-shaped liners.

6. The method of claim 1, wherein the step of forming a single crystalline semiconductor material includes an excimer laser annealing step.

7. The method of claim 1, wherein the amorphous semiconductor material includes silicon.

8. The method of claim 1, wherein the substrate includes single crystalline silicon.

9. The method of claim 1, wherein the amorphous semiconductor material includes silicon germanium.

10. A method of manufacturing an ultra-large scale integrated circuit including a transistor, the method comprising:
providing a gate structure on a top surface of a substrate, the gate structure including L-shaped liners, a gate conductor, and a high-k gate dielectric;
depositing an amorphous semiconductor material above the top surface of the substrate and over the gate structure;
removing a portion of the amorphous semiconductor material to expose the gate structure; and
crystallizing the amorphous semiconductor material in an annealing process.

11. The method of claim 10, further comprising:
proving spacers adjacent to the L-shaped liners; and
providing a source and drain extension amorphization implant before the spacers are provided.

12. The method of claim 11, further comprising:
providing a source and drain dopant implant before the pacers are provided.

13. The method of claim 12, further comprising:
providing a silicide layer above the substrate.

14. The method of claim 13, wherein the silicide layer is provided by siliciding at a temperature of less than 500° C.

15. The method of claim 14, wherein the siliciding step is a nickel silicide step.

16. The method of claim 15, wherein the gate conductor is a metal.

17. A process of forming a transistor with elevated source and drain regions, the process comprising:
providing a gate structure having a high-k gate dielectric above a substrate;
providing an amorphization implant to the substrate;
providing a spacer structure to the gate structure, the spacer structure including L-shaped liners;
depositing an amorphous semiconductor material above the a substrate and the gate structure;
removing a portion of the amorphous semiconductor material to expose the gate structure; and
crystallizing the amorphous semiconductor material to form single crystalline material.

18. The process of claim 17, further comprising:
doping the substrate for shallow source and drain extensions before the spacer structure is provided.

19. The process of claim 17, wherein the amorphous semiconductor material is crystallized by a laser.

20. The process of claim 17, wherein the L-shaped liners include silicon dioxide.

* * * * *